(12) United States Patent
Janzen

(10) Patent No.: US 7,340,584 B2
(45) Date of Patent: *Mar. 4, 2008

(54) SEQUENTIAL NIBBLE BURST ORDERING FOR DATA

(75) Inventor: Jeffery W. Janzen, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 11/407,780

(22) Filed: Apr. 20, 2006

(65) Prior Publication Data

US 2006/0190677 A1 Aug. 24, 2006

Related U.S. Application Data

(60) Continuation of application No. 10/778,257, filed on Feb. 13, 2004, now Pat. No. 7,085,912, which is a division of application No. 10/008,710, filed on Dec. 7, 2001, now Pat. No. 6,775,759.

(51) Int. Cl.
*G06F 12/00* (2006.01)

(52) U.S. Cl. .............. 711/217; 711/167; 711/204; 711/213

(58) Field of Classification Search ........ 711/167, 711/204, 213, 217

See application file for complete search history.

(56) References Cited

U.S. PATENT DOCUMENTS

| | | | |
|---|---|---|---|
| 5,659,713 A | 8/1997 | Goodwin et al. | |
| 5,764,590 A | 6/1998 | Iwamoto et al. | |
| 5,768,212 A | 6/1998 | Fujita | |
| 5,802,005 A | 9/1998 | Nakamura et al. | |
| 5,815,460 A | 9/1998 | Watanabe | |
| 5,881,017 A | 3/1999 | Matsumoto et al. | |
| 5,892,730 A | 4/1999 | Sato et al. | |
| 5,953,278 A | 9/1999 | McAdams et al. | |
| 5,996,043 A | 11/1999 | Manning | |
| 6,081,479 A * | 6/2000 | Ji et al. | 365/233 |
| 6,115,321 A | 9/2000 | Koelling et al. | |
| 6,134,180 A | 10/2000 | Kim et al. | |
| 6,137,735 A * | 10/2000 | Wei et al. | 365/200 |
| 6,172,893 B1 | 1/2001 | Ryan | |
| 6,240,047 B1 * | 5/2001 | Koelling et al. | 365/233 |
| 6,385,100 B2 | 5/2002 | Noda et al. | |
| 6,658,523 B2 | 12/2003 | Janzen et al. | |
| 6,775,759 B2 * | 8/2004 | Janzen | 711/217 |
| 6,779,074 B2 | 8/2004 | Janzen | |

* cited by examiner

*Primary Examiner*—Reba I. Elmore
(74) *Attorney, Agent, or Firm*—Edward L. Pencoske; Jones Day

(57) ABSTRACT

A combination of circuits for use in a memory device is comprised of a decode circuit responsive to a first portion of address information for identifying a word to be read or written. The decode circuit is further responsive to a second portion of the address information for identifying an order in which one or more portions of the identified word are to be read or written. An address sequencer routes at least one bit of the address information. A sequencer circuit is responsive to the address sequencer for ordering the plurality of data bits within each portion of the identified word.

14 Claims, 4 Drawing Sheets

SEQUENTIAL NIBBLE BURST ORDERING FOR DATA

CROSS REFERENCE TO RELATED CASES

This application is a continuation of U.S. patent application Ser. No. 10/778,257 filed Feb. 13, 2004 now U.S. Pat. No. 7,085,912 and entitled Sequential Nibble Burst Ordering for Data, which is a divisional of U.S. patent application Ser. No. 10/008,710 filed Dec. 7, 2001 and entitled Sequential Nibble Burst Ordering for Data, now U.S. Pat. No. 6,775,759.

BACKGROUND OF THE INVENTION

1. Field of the Invention

The present invention is directed to memory devices and, more particularly, to methods and circuits for reading information into and out of a memory device.

2. Description of the Background

Computer designers are continually searching for faster memory devices that will permit the design of faster computers. A significant limitation on a computer's operating speed is the time required to transfer data between a processor and a memory circuit, such as a read or write data transfer. Memory devices such as dynamic random access memories (DRAMs), synchronous dynamic random access memories (SDRAMs), flash memories, etc. typically include a large number of memory cells arranged in one or more arrays, each array comprised of rows and columns. Each memory cell provides a location at which the processor can store and retrieve one bit of data, sometimes referred to as a memory bit or m-bit. The more quickly the processor can access the data within the memory cells, the more quickly it can perform a calculation or execute a program using the data.

FIG. 1 shows, in part, a typical computer system architecture. A central processing unit (CPU) or processor 10 is connected to a processor bus 12, which in turn is connected to a system or memory controller 14. The memory controller 14 may be connected to an expansion bus 16. The memory controller 14 serves as interface circuitry between the processor 10 and a memory device 18. The processor 10 issues a command and an address which are received and translated by the memory controller 14. The memory controller 14 applies the translated command signals on a plurality of command lines 20 and the translated address on a plurality of address lines 22 to the memory device 18. These command signals are well known in the art and include, in the case of a DRAM, RAS (row address strobe), CAS (column address strobe), WE (write enable) and OE (output enable), among others. A clock signal is also provided on CLK lines 24. Corresponding to the processor-issued command and address, data is transferred between the controller 14 and the memory 18 via datapath lines 26.

Methods exist to enable memory devices, such as DRAM memory 18, to appear to external devices to be operating faster than the time it takes for the memory device to retrieve data from the array. These methods include pipeline and prefetch methods of operation. The pipeline method divides internal processing into a number of stages and sequentially processes information relating to one unit of data through each stage. Processing in each stage is carried out simultaneously in parallel, such that the rate at which data can be output from the device can be greater than the rate at which data is retrieved from the array. In the prefetch method, all internal processing is carried out in parallel, and parallel to serial conversion is performed at the input/output section.

Both the pipeline and prefetch methods can be used to support, for example, a burst mode of operation. The burst mode of operation is a mode of operation in which the starting address for a data string is provided to the memory device. The data string to be read out of the memory or written into the memory is then synchronously output or input, respectively, with a clock signal.

Historically, synchronous DRAMs have supported both an interleaved and a sequential burst mode of operation. Advance DRAM technology standards are being defined with an 8-bit external prefetch and capability to support a 4-bit or 8-bit internal prefetch. With a 4-bit internal prefetch, the sequential read or write crosses a boundary and is therefore difficult to implement as illustrated by the following table, Table 1.

TABLE 1

| Starting Address | Internal Bits [0 1 2 3] | Internal Bits [4 5 6 7] |
|---|---|---|
| 0 | 0 1 2 3 | 4 5 6 7 |
| 1 | 1 2 3 4 | 5 6 7 0 |
| 2 | 2 3 4 5 | 6 7 0 1 |
| 3 | 3 4 5 6 | 7 0 1 2 |
| 4 | 4 5 6 7 | 0 1 2 3 |
| 5 | 5 6 7 0 | 1 2 3 4 |
| 6 | 6 7 0 1 | 2 3 4 5 |
| 7 | 7 0 1 2 | 3 4 5 6 |

As seen from Table 1, except for starting addresses 0 and 4, the sequential burst cannot be executed without an 8-bit internal burst, adding cost, or a dual prefetching, which adds latency.

The existing interleave burst mode supports a 4-bit internal prefetch but some applications still use a sequential type of access burst mode. One solution is to always start the read burst at index 0 and sequence through the data. That solution is acceptable only when the word stored at index 0 is the next critical word. If the critical word is indexed at any other location, latency is introduced.

Thus, the need exists for a method and apparatus for enabling both 8-bit and 4-bit internal prefetches for new architectures without adding cost or latency to the new architecture.

SUMMARY OF THE INVENTION

The present invention is directed to a memory device comprising a plurality of arrays of memory cells and peripheral devices for reading information out of and for writing information into the memory cells. The peripheral devices include a decode circuit responsive to a first portion of address information for identifying an address and is further responsive to a second portion of the address information for identifying an order. The address may be a read address or a write address, and the order may be the order for reading data or writing data, respectively.

The present invention also includes a read sequencer circuit or both a write sequencer circuit and a read sequencer circuit for reordering bits to be written to or read from, as the case may be, the memory in response to another portion of the address information. The necessary address information is routed to the sequencer circuits by an address sequencer.

The present invention is also directed to a method of reading a word from a memory array in at least two prefetch operations, wherein the order of the prefetch operations is controlled by an address bit, or writing a word in two n-bit bytes under the control of the address bit.

In one implementation of the present invention, the new burst sequence splits, for example, an 8-bit burst into two 4-bit bursts with a sequential interleave within each burst sequence. That enables each of the 4-bit bursts to be output from a memory array before the 8-bit burst is required to be output from the memory device. To implement that operation, the most significant column address bits (for example CA3-CAi) identify which 8-bit burst is selected. Those address bits may be referred to as a first portion of the address information. Address bit CA2, referred to as a second portion of the address information, identifies which of the two 4-bit bursts are fetched first from the memory array. CA0 and CA1 may then be used to identify which of the prefetched 4-bits are to be asserted first, with the remaining 3 bits output in sequential order from the first bit.

The present invention allows sequential type of interleaves for applications requiring them and provides access to the most critical word first without adding any latency to the system. Those, and other advantages and benefits, will become apparent from the detailed description of the preferred embodiments hereinbelow.

BRIEF DESCRIPTION OF THE DRAWINGS

For the present invention to be easily understood and readily practiced, the present invention will now be described, for purposes of illustration and not limitation, in conjunction with the following figures, wherein.

DETAILED DESCRIPTION OF THE PREFERRED EMBODIMENTS

Advanced DRAM technology (ADT) specifies an 8-bit external prefetch and supports either a 4 or 8-bit internal prefetch. Typical DRAMs support a sequential and an interleaved burst mode of operation. However, a sequential interleave is not compatible with a DRAM having a double pumped 4-bit internal prefetch DRAM architecture. The present invention allows for a new burst ordering sequence to support a multiple internal prefetch architecture for applications requiring a sequential-like burst sequence. The present invention allows sequential types of interleaves for applications requiring them, and provides access to the most critical word first.

Figure 1:
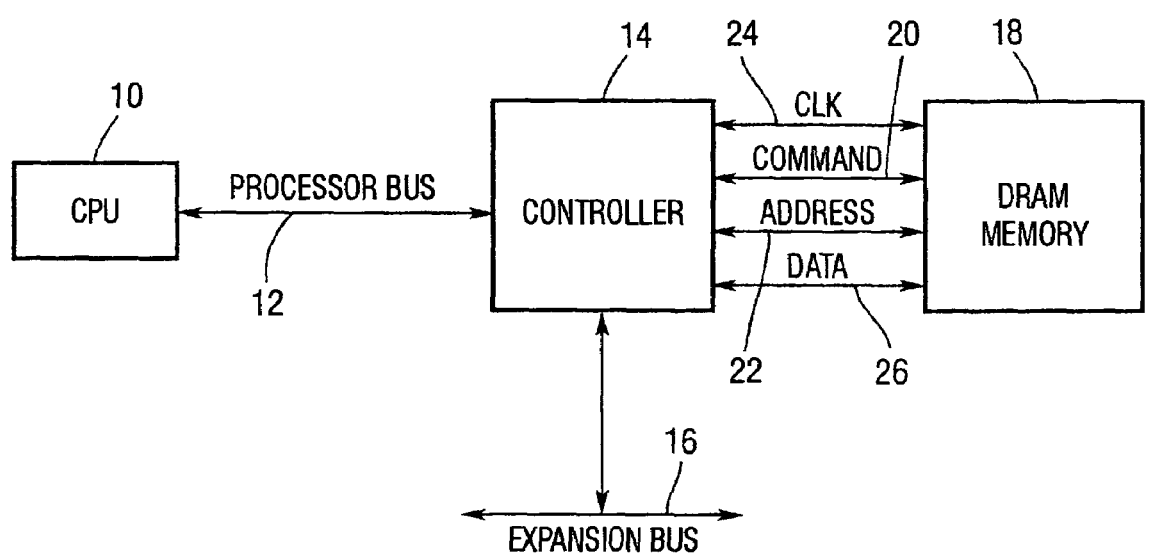
FIG. 1 is a functional block diagram of a typical computer system architecture.
Figure 2:
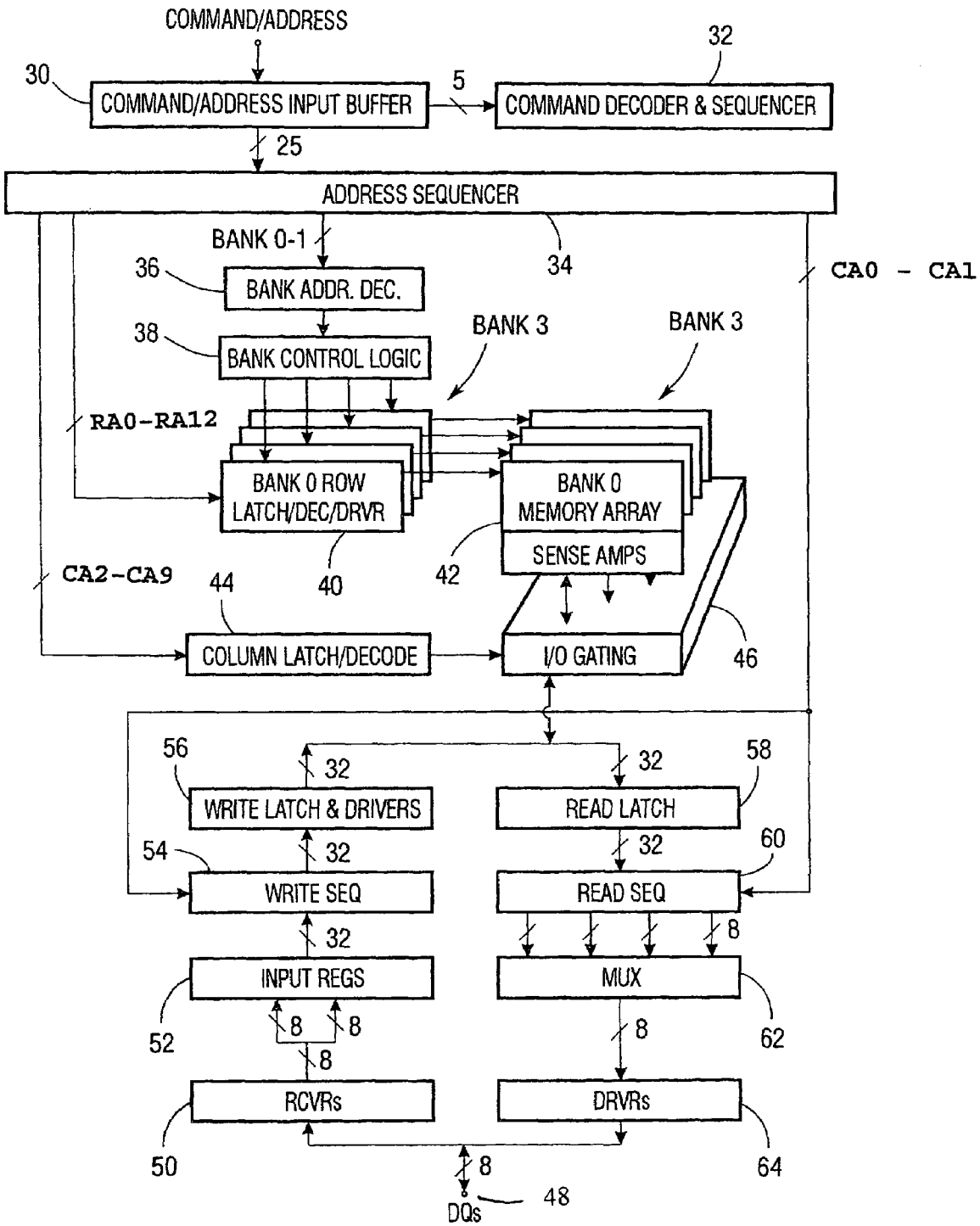
FIG. 2 is simplified block diagram of an architecture for a DRAM capable of implementing the present invention.

Turning now to FIG. 2, FIG. 2 illustrates a simplified block diagram of an architecture for a DRAM capable of implementing the present invention. The DRAM memory device 29 is comprised of a command/address input buffer 30 responsive to a command bus or command lines and an address bus or address lines. A command decoder and sequencer 32 and an address sequencer 34 are each responsive to the command/address input buffer 30.

A bank address decoder 36 is responsive to the address sequencer 34 while bank control logic 38 is responsive to the bank address decoder 36. A series of row latch/decoder/drivers 40 is responsive to the bank control logic 38 and the address sequencer 34. One row latch/decoder/driver 40 is provided for each memory array 42. Illustrated in FIG. 2 are four memory arrays labeled bank 0 through bank 3. Accordingly, there are four row latch/decoder/driver circuits 40, one provided for each of bank 0 through bank 3.

A column latch/decode circuit 44 is responsive to the address sequencer 34. The column latch/decode circuit 44 receives the most significant bits of the column address CA3-CAi, where "i" in the present example equals 9. The most significant bits CA3-CAi may be thought of as a first portion of the address and is used for identifying a word to be read. The column latch/decode circuit 44 also receives one of the least significant column address bits CA0-CA2; in the present example, the column latch/decode circuit 44 receives the column address bit CA2 which may be referred to as a second portion of the address. The identified word which is to be read may be, for example, an 8-bit word. The word will be read in two 4-bit bytes, and the second portion of the address identifies which of the first or the second n-bit bytes is to be read first.

An input/output (I/O) gating circuit 46 is responsive to the column latch/decode circuit 44 and is coupled to the sense amplifiers within each of the memory arrays 42.

The DRAM 29 may be accessed through a plurality of data pads 48 for either a write operation or a read operation. For a write operation, data on data pads 48 is received by receivers 50 and passed to input registers 52. A write sequencer circuit 54 orders the two 4-bit bytes comprising each 8-bit byte in response to, for example, column address bits CA0-CA1. The ordered bytes are then input to a write latch and driver circuit 56 for input to the memory arrays 42 through the I/O gating circuit 46. Data which is to be read from the memory arrays 42 is output through the I/O gating circuit 46 to a read latch 58. From the read latch 58, the information is input to a read sequencer circuit 60 which orders the read data in response to, for example, column address bits CA0-CA1. The ordered data is then output to an output multiplexer (mux) 62 and then onto the data pads 48 through drivers 64.

The command/address input buffer 30, command decoder and sequencer 32, address sequencer 34, bank address decoder 36, bank control logic 38, the row latch/decoder/drivers 40, column latch/decode circuit 44, I/O gating circuit 46, the receivers 50, input registers 52, write sequencer circuit 54, write latch and driver circuit 56, read latch 58, read sequence circuit 60, output mux 62 and drivers 64 are considered to be a plurality of peripheral devices for reading information out of and writing information into the memory cells of the arrays. The description of the forgoing elements as a plurality of peripheral devices is intended to provide a description of the presently preferred embodiment, and is not intended to limit the scope of the invention to only the recited devices. Those of ordinary skill in the art will recognize that other combinations of devices may be used to implement the plurality of peripheral devices, particularly where other memory architectures are used.

In general terms, the purpose of the read sequencer circuit 60 is to reorder the prefetched portions of the read word in response to certain of the least significant address bits CA0-CA2; in this example CA0 and CA1 are used.

The following table illustrates the ordering of the portions of a word, and of the ordering of the bits within each prefetch portion (or group), for a sequential burst mode operation according to one embodiment. The first n-bit prefetch (in this example, the first 4-bit prefetch is identified by CA2) is reordered according to the start address further identified by CA0 and CA1 as follows:

| CA2 | CA1 | CA0 | Starting Address | First n-bit Prefetch Internal Bits | Second n-bit Prefetch Internal Bits |
|---|---|---|---|---|---|
| 0 | 0 | 0 | 0 | 0 1 2 3 | 4 5 6 7 |
| 0 | 0 | 1 | 1 | 1 2 3 0 | 5 6 7 4 |
| 0 | 1 | 0 | 2 | 2 3 0 1 | 6 7 4 5 |
| 0 | 1 | 1 | 3 | 3 0 1 2 | 7 4 5 6 |
| 1 | 0 | 0 | 4 | 4 5 6 7 | 0 1 2 3 |
| 1 | 0 | 1 | 5 | 5 6 7 4 | 1 2 3 0 |
| 1 | 1 | 0 | 6 | 6 7 4 5 | 2 3 0 1 |
| 1 | 1 | 1 | 7 | 7 4 5 6 | 3 0 1 2 |

In operation, when a read command is received, the value on the bank address inputs BA0 and BA1 (Bank 0-1) selects one of the memory arrays 42. Address information is then received which identifies a row or rows within each array 42. The address provided on inputs CA3 through CAi (where "i" in the present example equals 9) selects the starting column location. Referring to FIG. 2, CA3-CA9 are input to the column latch/decode circuit 44 to identify a word to be read. CA2 is also input to the column latch/decode circuit 44 for the purpose of identifying which portion of the word is to be read first. For example, when CA2 is set to zero (0), the first n-bit prefetch contains internal bits 0, 1, 2, and 3 and the second n-bit prefetch contains internal bits 4, 5, 6, and 7. When CA2 is set to one (1), the first n-bit prefetch contains internal bits 4, 5, 6, and 7 and the second n-bit prefetch contains internal bits 0, 1, 2, and 3. The bits CA0 and CA1 are input to the read sequencer circuit 60. That information identifies the start address such that the bits can be reordered thereby enabling the most critical word to be output first by the mux 62. For example when CA2 is set to zero (0), CA1 is set to zero (0), and CA0 is set to zero (0) (i.e., at staring address 0), the internal bits in the first n-bit prefetch are in the order 0, 1, 2, 3 and the internal bits in the second n-bit prefetch are in the order 4, 5, 6, 7. Whereas when CA2 is set to zero (0), CA1 is set to one (1), and CA0 is set to zero (0) (i.e., at staring address 2), the internal bits in the first n-bit prefetch are in the order 2, 3, 0, 1 and the internal bits in the second n-bit prefetch are in the order 6, 7, 4, 5.

For a write operation, the bank is identified in the same manner as for a read operation. Similarly, the starting column address is identified in the same manner. The signals available at inputs CA0-CA1 are input to write sequencer 54 which reorders the bits as described. Although FIG. 2 shows both a write sequencer circuit 54 and a read sequencer circuit 60, the memory can operate with just the read sequencer circuit 60.

Figure 3A:
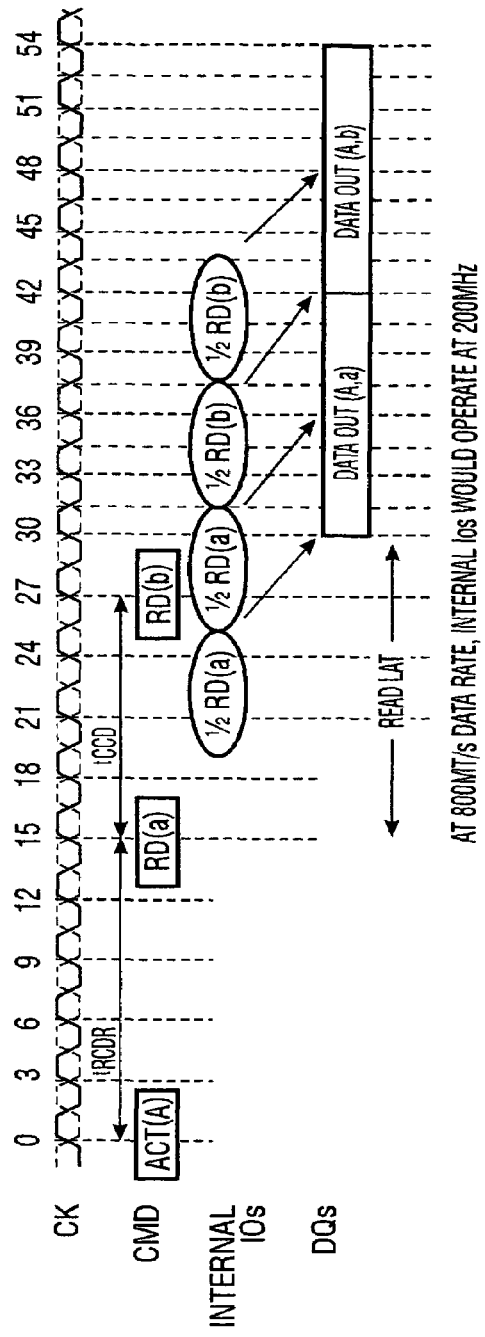
FIGS. 3A and 3B are timing diagrams of an 8-bit external prefetch completed using a 4-bit internal prefetch and an 8-bit external prefetch completed using an 8-bit internal prefetch, respectively.

FIG. 3A illustrates a timing diagram for an 8-bit external prefetch using a 4-bit internal prefetch. As can be seen, after the read latency period, the data available at the output pads appears as an 8-bit byte, although the word was constructed from two 4-bit bytes. While the first 8-bit byte is made available at the data pads, a next 8-bit byte can be processed internally in two 4-bit prefetches as shown in the figure. In contrast, in FIG. 3B, the 8-bit byte is prefetched from the memory in one step.

The timing diagram illustrated in FIG. 3A is the timing diagram for a 4-bit double pumped array. The array runs at a frequency of ¼ that of the I/O frequency. Because not all 8 bits of data may be available for data scramble prior to the memory device outputting data to the external data pads, a data scramble (i.e., reorder) must be performed on the 4 bit boundaries. That places a limit on the maximum data frequency that can be supported.

Figure 3B:
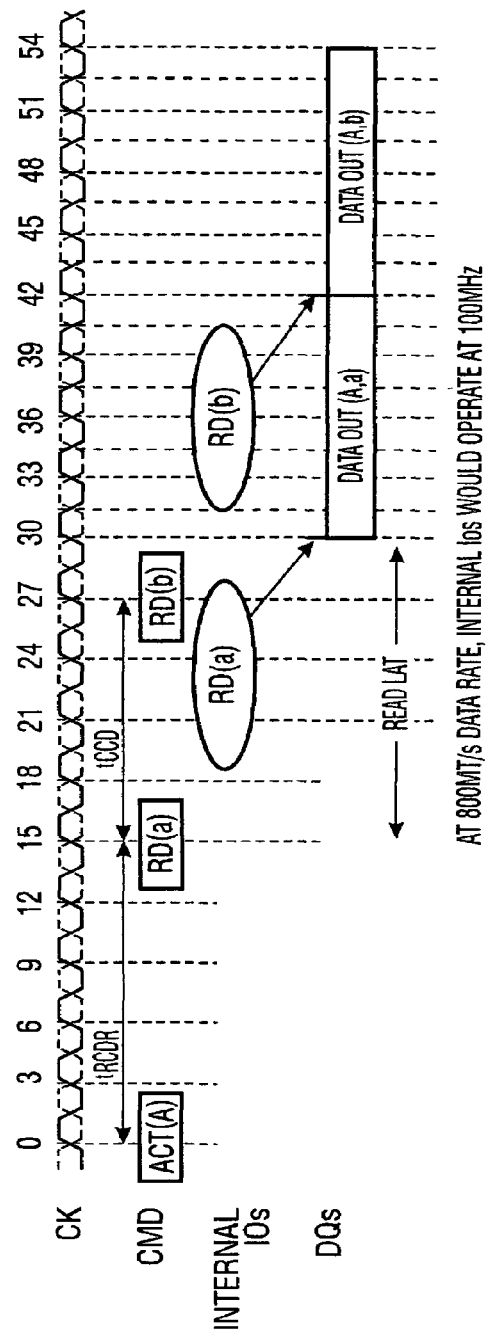

The timing diagram illustrated in FIG. 3B illustrates an 8-bit single pumped array. That array runs at a frequency of ⅛ of that of the I/O frequency. All 8 bits are available for data scramble prior to outputting data to the data pads, such that the output scramble may be completed on an 8 bit byte. The maximum data frequency is scalable (the core is not a limiting factor) at the expense of die size.

Advantages of the present invention include the ability to support 4-bit internal prefetches at low cost with no addition to device latency, the critical word needed by the system is output first, and a sequential type burst for applications not supporting interleaved bursts is possible.

The present invention is also directed to a method of reading a word from a memory array in at least two prefetch operations, wherein the order of the prefetch operations is controlled by at least one address bit. The present invention is also directed to a method of outputting an n-bit word in two ½ n-bit prefetch steps from a plurality of memory arrays in response to an address bit. The present invention is also directed to a method comprised of prefetching the first portion of a word from a memory array and prefetching a second portion of the word from the memory array in an order determined by an address bit.

Figure 4:
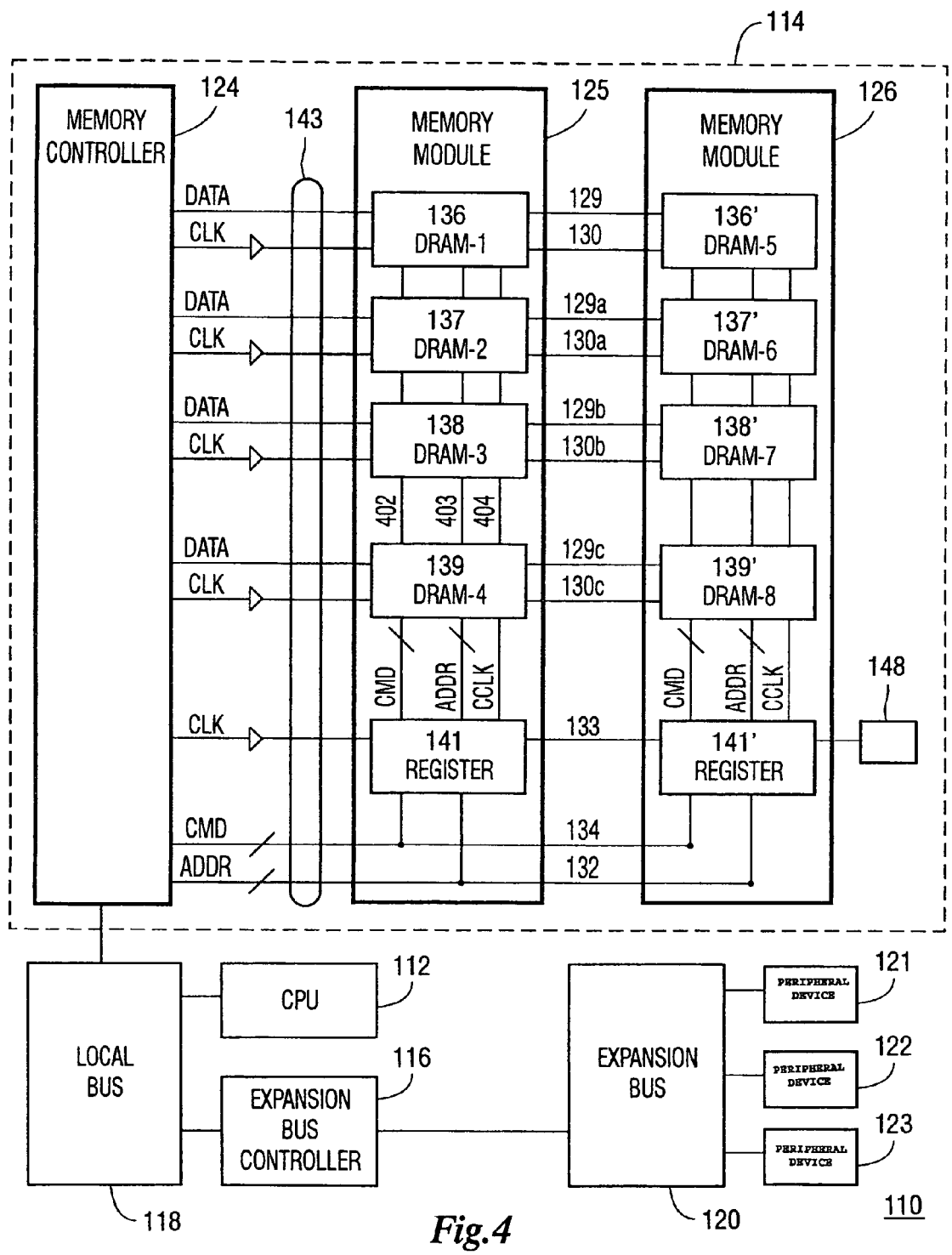
FIG. 4 is a simplified block diagram of a computer system in which the present invention may be used.

FIG. 4 is a block diagram of one example of a computer system 110 in which the present invention may be implemented. The computer system 110 includes a processor or central processing unit (CPU) 112, a memory subsystem 114, and an expansion bus controller 116. The memory subsystem 114 and the expansion bus controller 116 are coupled to the processor 112 via a local bus 118. The expansion bus controller 116 is also coupled to at least one expansion bus 120, to which various peripheral devices 121-123 such as mass storage devices, keyboard, mouse, graphic adapters, and multimedia adapters may be attached. Processor 112 and memory subsystem 114 may be integrated on a single chip.

The memory subsystem 114 includes a memory controller 124 which is coupled to a plurality of memory modules 125, 126 via a plurality of signal lines 129, 130, 129a, 130a, 129b, 130b, 129c and 130c. The plurality of data signal lines 129, 129a, 129b, 129c are used by the memory controller 124 and the memory modules 125, 126 to exchange data DATA. Addresses ADDR are signaled over a plurality of address signal lines 132, clock signals CLK are applied on clock lines 130, 130a, 130b, 130c, and 133, and commands CMD are signaled over a plurality of command signal lines 134. The memory modules 125, 126 include a plurality of memory devices 136-139, 136'-139' and a register 141, 141', respectively. Each memory device 136-139, 136'-139' may be a high speed synchronous memory device. Although only two memory modules 125, 126 and associated signal lines 129-129c, 130-130c are shown in FIG. 4, it should be noted that any number of memory modules can be used.

The plurality of signal lines 129-129c, 130-130c, 132, 133, 134 which couple the memory modules 125, 126 to the memory controller 124 are known as the memory bus 143. The memory bus 143 may have additional signal lines which are well known in the art, for example chip select lines, which are not illustrated for simplicity. Each column of memory devices 136-139, 136'-139' spanning the memory bus 143 is known as a rank of memory. Generally, single side memory modules, such as the ones illustrated in FIG. 4, contain a single rank of memory. However, double sided memory modules containing two ranks of memory may also be used.

Read data is output serially synchronized to the clock signal CLK, which is driven across a plurality of clock signal lines, 130, 130a, 130b, 130c. Write data is input serially synchronized to the clock signal CLK, which is driven across the plurality of clock signal lines 130, 130a, 130b, 130c by the memory controller 124. Commands and addresses are also clocked using the clock signal CLK which is driven by the memory controller 124 across the registers 141, 141' of the memory modules 125, 126, respectively, to a terminator 148. The command, address, and clock signal lines 134, 132, 133, respectively, are directly coupled to the registers 141, 141' of the memory modules 125, 126, respectively. The registers 141, 141' buffer those signals before they are distributed to the memory devices 136-139, 136'-139' of the memory modules 125, 126, respectively.

While the present invention has been described in conjunction with preferred embodiments thereof, those of ordinary skill in the art will recognize that many modifications and variations are possible. Such modifications and variations fall within the scope of the present invention which is limited only by the following claims.

What is claimed is:

1. A combination of circuits for use in a memory device, comprising:
   a decode circuit responsive to a first portion of address information for identifying a word to be read or written, said decode circuit further responsive to a second portion of the address information for identifying an order in which one or more portions of said identified word are to be read or written, wherein each of said portions is comprised of a plurality of data bits;
   an address sequencer for routing said second portion of the address information; and
   a sequencer circuit responsive to said second portion of the address information from said address sequencer for ordering said plurality of data bits within each portion of said identified word, said ordering being based upon the contents of said second portion of the address information.

2. The combination of claim 1 wherein said sequencer circuit comprises at least one of a read sequencer circuit and a write sequencer circuit.

3. The combination of claim 1 wherein an order of a specific group of data bits within a first portion of said identified word is the same as an order of a specific group of data bits in a second portion of said identified word.

4. The combination of claim 1 wherein said address sequencer routes column address bits CA0 and CA1 to said sequencer circuit.

5. The combination of claim 1 wherein said decode circuit is responsive to column address bits CA3 through CAi for identifying said word and is responsive to column address bit CA2 for identifying said order in which one or more portions of said identified word are to be read or written.

6. A combination of circuits for use in a memory device, comprising:
   a decode circuit responsive to a first portion of address information for identifying a word to be read, said decode circuit further responsive to a second portion of the address information for identifying an order in which one or more portions of said word are read;
   an address sequencer for routing said second portion of the address information; and
   a read sequencer responsive to said second portion of the address information from said address sequencer for ordering said plurality of data bits within each portion of said identified word so as to enable a sequential burst output sequence independently of said internal prefetch architecture, said ordering being based upon the contents of said second portion of the address information.

7. The combination of claim 6 additionally comprising a write sequencer circuit responsive to said address sequencer.

8. The combination of claim 6 wherein said address sequencer routes column address bits CA0 and CA1 to said sequencer circuit.

9. The combination of claim 8 wherein said decode circuit is responsive to column address bits CA3 through CAi for identifying said word, and is responsive to column address bit CA2 for identifying an order in which one or more portions of said word are read.

10. The combination of claim 6 wherein said portions of said word are comprised of two n-bit bytes of data bits.

11. The combination of claim 10 wherein said portions of said word are comprised of two n-bit bytes of data bits.

12. A combination of circuits for use in a memory device, comprising:
    a decode circuit responsive to column address bits CA3 through CAi for identifying a word to be written, said decode circuit further responsive to column address bit CA2 for identifying an order in which one or more portions of said identified word are to be written;
    an address sequencer for routing column address bit CA2; and
    a write sequencer circuit responsive to column address bit CA2 for ordering said plurality of data bits within each portion of said identified word, said ordering being based upon the state of said second address bit CA2.

13. The combination of claim 12 wherein an order of a group of data bits within a first portion of said identified word is the same as the order of a specific group of data bits in a second portion of said identified word.

14. The combination of claim 12 additionally comprising a read sequencer circuit responsive to column address bit CA2.

* * * * *